(12) United States Patent
Nakahori et al.

(10) Patent No.: US 6,236,062 B1
(45) Date of Patent: May 22, 2001

(54) LIQUID CRYSTAL DISPLAY AND THIN FILM TRANSISTOR WITH CAPACITIVE ELECTRODE STRUCTURE

(75) Inventors: Tadaki Nakahori; Tetsuya Sakoguchi, both of Kumamoto; Kazuhiko Noguchi, Tokyo; Kouji Yabushita, Tokyo; Takeshi Kubota, Tokyo, all of (JP)

(73) Assignees: Kabushiki Kaisha Advanced Display, Kumamoto; Mitsubishi Electric Corporation, Tokyo, both of (JP)

( * ) Notice: Subject to any disclaimer, the term of this patent is extended or adjusted under 35 U.S.C. 154(b) by 0 days.

(21) Appl. No.: 09/166,175

(22) Filed: Oct. 5, 1998

(30) Foreign Application Priority Data

Oct. 21, 1997 (JP) ...................................... 9-288299

(51) Int. Cl.$^7$ .................................................. H01L 29/00
(52) U.S. Cl. .......................... 257/59; 257/347; 257/249; 257/382; 257/383; 257/384; 438/151; 438/161
(58) Field of Search ..................... 257/59, 347, 359–365, 257/249, 382–384; 438/151, 161

(56) References Cited

U.S. PATENT DOCUMENTS

| | | | |
|---|---|---|---|
| 5,995,175 | * 11/1999 | Kim et al. | 349/42 |
| 6,025,216 | * 2/2000 | Ha | 438/161 |

* cited by examiner

*Primary Examiner*—Fetsum Abraham
(74) *Attorney, Agent, or Firm*—McDermott, Will & Emery

(57) ABSTRACT

A manufacturing process OF a thin film transistor is provided, in which occurrence of a dry spot and occurrence of an etch residue of an ohmic contact layer (n$^+$ a-Si:H film) due to the dry spot are prevented in photoengraving process for patterning a semiconductor layer and the ohmic contact layer into an island, without any further treatment by any other apparatus.

After forming the a-Si:H film 4*a* which forms the semiconductor layer of the TFT and the n$^+$ a-Si:H film 5*a* which forms the ohmic contact layer, a N$_2$ gas plasma discharge is continuously performed using the same plasma CVD apparatus, thereby forming a very thin silicon nitride film 6 having a hydrophilic property on a surface layer of the n$^+$ a-Si:H film 5*a*.

8 Claims, 2 Drawing Sheets

PRIOR ART

PRIOR ART

LIQUID CRYSTAL DISPLAY AND THIN FILM TRANSISTOR WITH CAPACITIVE ELECTRODE STRUCTURE

BACKGROUND OF THE INVENTION

1. Industrial Field of the Invention

The present invention relates to an active matrix type liquid crystal display and to a manufacturing process of a thin film transistor (hereinafter referred to as TFT) used as a drive element in the liquid crystal display.

2. Prior Art

Recent years, the active matrix type liquid crystal display device comprising a TFT array substrate composed by arranging a TFT on a transparent insulating substrate such as glass forming a matrix and a liquid crystal, has been commercialized into a flat display under the expectation of flattening of image display, and has now a bright future in view of developing a large market of notebook type personal computer, OA monitor, etc.

In the greater part of the TFT, an amorphous silicon capable of being deposited on a large area at a relatively low temperature is employed as a semiconductor layer. An example is illustrated in FIG. 3 showing a sectional view of an essential part of a TFT array on which a TFT is mounted and in FIG. 4 showing a sectional view of the TFT array under manufacture. In the drawings, reference numeral 1 designates an insulating substrate, numeral 2 designates a gate electrode formed on the insulating substrate 1, numeral 3 is a gate insulating film formed to coat the gate electrode 2 and an auxiliary capacity electrode 8, numeral 4 is a semiconductor layer composed of a-Si:H (amorphous silicon to which hydrogen atom is added) film 4a formed on the gate electrode 2 through the gate insulating film 3, numeral 5 is an ohmic contact layer composed of a $n^+$ a-Si:H film 5a formed on the semiconductor layer 4, numeral 9 is a picture element electrode, numerals 10 and 11 are a pair of electrodes (source electrode 10 and drain electrode 11) formed on the ohmic contact layer 5, and numeral 12 is a passivation film formed to coat the entire device.

A manufacturing process of the mentioned conventional TFT is hereinafter described. After forming a first conductive thin film on the insulating substrate 1, the first conductive thin film is patterned by photoengraving process, whereby the gate electrode 2 and the auxiliary capacity electrode 8 are formed. Then, after forming continuously the gate insulating film 3, the a-Si:H film 4a and the $n^+$ a-Si:H film 5a by plasma CVD, the a-Si:H film 4a and the $n^+$ a-Si:H film 5a are patterned into an island, whereby the semiconductor layer 4 and the ohmic contact layer 5 are formed. After forming a second conductive thin film, the second conductive thin film is patterned by photoengraving process, whereby the picture element electrode 9 is formed. After forming a third conductive thin film composed of Al—Si alloy, etc., the third conductive thin film is patterned by photoengraving process, whereby the source electrode 10 and the drain electrode 11 are formed. The ohmic contact layer 5 is then etched using the source electrode 10 and the drain electrode 11 as a mask, and the ohmic contact layer 5 is cut into two parts. The passivation film 12 is then formed by plasma CVD. Thus, a TFT array on which TFT is mounted is formed.

FIG. 4 shows a sectional view after having continuously formed the a-Si:H film 4a which forms the semiconductor layer 4 and the $n^+$ a-Si:H film 5a which forms the ohmic contact layer 5. In the conventional manufacturing process, however, since the a-Si:H film 4a and the $n^+$ a-Si:H film 5a are further patterned into an island, a photoresist is applied to the two films after performing a wet cleaning, and a resist pattern is formed through the steps of exposure and development. At this time, as the surface of the $n^+$ a-Si:H film 5a has a hydrophobic property and a low wettability immediately after forming the film, a dry spot is produced at the time of drying after the wet cleaning. When such a dry spot is produced, in the step of etching the ohmic contact layer 5 (the $n^+$ a-Si:H film 5a) using the source electrode 10 and the drain electrode 11 as a mask, the dry spot performs as the mask and an etch residue is produced or left, which brings about a failure or defect such as short circuit between the source electrode 10 and the drain electrode 11, and if using such a defective TFT as a drive element of a liquid crystal display, any display failure is caused in the liquid crystal display.

To prevent such a dry spot, it is effective to make hydrophilic the surface of the $n^+$ a-Si:H film 5a which forms the ohmic contact layer 5, and therefore in the conventional manufacturing process, for example, an UV treatment step is added between the step of forming the film by the plasma CVD apparatus and the step of wet cleaning, so that the surface of the $n^+$ a-Si:H film 5a is oxidized and a hydrophilic property is given thereto.

Since the conventional treatment for giving a hydrophilic property to the surface of the $n^+$ a-Si:H film 5a, which is applied in view of preventing the production or occurrence of the dry spot resulting in the undesirable etch residue at the time of patterning the $n^+$ a-Si:H film 5a which forms the ohmic contact layer 5, is an UV treatment as mentioned above, such a treatment cannot be applied by any manufacturing apparatus used just for forming the ohmic contact layer, but any additional treatment step by using other apparatus is required. Hence, there arises a problem of lowering a productivity.

SUMMARY OF THE INVENTION

The present invention was made to solve the above-discussed problem and has an object of providing a process for manufacturing a highly reliable thin film transistor at a high yield without lowering a productivity, in which occurrence of a dry spot and occurrence of an etch residue of the ohmic contact layer ($n^+$ a-Si:H film) due to the dry spot are prevented in the photoengraving process for patterning the semiconductor layer and the ohmic contact layer into an island, without any further treatment by any other apparatus.

Another object of the invention is to produce a highly reliable liquid crystal display at a high yield by mounting a TFT having no etch residue of the $n^+$ a-Si:H film which forms the ohmic contact layer as a drive element.

To accomplish the foregoing objects, a manufacturing process of a thin film transistor according to the invention comprises the steps of: forming a control electrode on a substrate; forming an insulating film, a semiconductor film and a contact film continuously on the control electrode; giving a hydrophilic property to a surface of said contact film by nitriding or oxidizing the surface of the contact film after forming the contact film; forming a semiconductor layer and a contact layer by forming a resist and patterning the semiconductor film and the contact film; forming a pair of electrodes which form a semiconductor device with the semiconductor layer; and etching the contact layer using the pair of electrodes as a mask.

It is preferable that the step of giving a hydrophilic property to the contact film is a nitriding treatment of the surface of the contact film by a $N_2$ gas plasma.

It is preferable that the step of giving a hydrophilic property to the contact film is a nitriding treatment of the surface of the contact film by a mixed gas plasma of $N_2$ and He.

It is preferable that the step of giving a hydrophilic property to the contact film is a nitriding treatment of the surface of the contact film by an $O_2$ gas plasma.

It is preferable that a thin film formed by the step of giving a hydrophilic property to the contact film is removed after forming the semiconductor layer and the contact layer.

A liquid crystal display according to the invention comprises: an insulating substrate; a control electrode formed on the insulating substrate; an insulating film formed on the control electrode; a semiconductor layer formed on the control electrode through said insulating film; a contact layer having a thin film nitride or oxide on a surface layer formed on the semiconductor layer; a pair of electrodes forming a semiconductor device with the semiconductor layer; a picture element electrode connected electrically to either of the pair of electrodes; and a counter substrate having a counter electrode, etc. for holding a liquid crystal material between itself and the insulating substrate.

In the mentioned manufacturing process according to the invention, since the treatment for giving a hydrophilic property is applied to the surface of the $n^+$ a-Si:H film by nitriding or oxidizing treatment after forming the a-Si:H film which forms the semiconductor layer and the $n^+$ a-Si:H film which forms the ohmic contact layer, the treatment can be performed by the same film formation apparatus as that for forming the ohmic contact layer, and a highly reliable thin film transistor can be manufactured at a high yield without lowering a productivity.

It is to be noted that a relatively cheap $N_2$ gas can be employed in the treatment for giving a hydrophilic property.

Further, static electricity can be removed at the same time as the treatment for giving a hydrophilic property.

Furthermore, a liquid crystal display having no etch residue of the $n^+$ a-Si:H film which forms the ohmic contact layer, and on which a highly reliable thin film transistor is mounted can be obtained at a high yield. In such a thin film transistor, the silicon nitride film and silicon oxide film each formed for giving a hydrophilic property to the $n^+$ a-Si:H film do not give any bad or negative influence on the TFT characteristic and on the characteristic as a liquid crystal drive element.

Other objects, features and advantages of the invention will become apparent in the course of the following description with reference to the accompanying drawings.

DESCRIPTION OF THE PREFERRED EMBODIMENT

EXAMPLE 1

Figure 1:
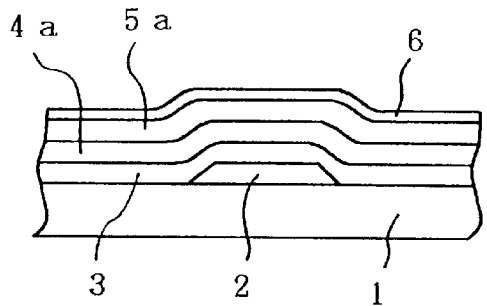
FIG. 1 is a sectional view of a thin film transistor under manufacture according to example 1 of the present invention.

A manufacturing process of a TFT according to an embodiment of the present invention is hereinafter described with reference to the drawings. FIG. 1 is a sectional view of a thin film transistor under manufacture according to example 1 of the invention. In the drawing, reference numeral 1 designates an insulating substrate, numeral 2 designates a control electrode (a gate electrode in this example) formed on the insulating substrate 1, numeral 3 is a gate insulating film formed to coat the gate electrode 2, numeral 4a is an a-Si:H (amorphous silicon to which hydrogen atom is added) film 4a formed on the gate electrode 2 through the gate insulating film 3 to form a semiconductor layer, numeral 5a is a $n^+$ a-Si:H film formed on the semiconductor layer 4 to form an ohmic contact layer, and numeral 6 is a silicon nitride film formed on a surface layer of the $n^+$ a-Si:H film 5.

The manufacturing process is now specifically described. After forming a conductive layer on the insulating substrate 1, the conductive layer is patterned by photoengraving process, whereby the gate electrode 2 is formed. Then, the gate insulating film 3, the a-Si:H film 4a and the $n^+$ a-Si:H film 5a are continuously formed by plasma CVD. At this time, the gate insulating film 3 may be formed into either a single layer structure or a multilayer structure, but considering the characteristics and wiring capacity of TFT, the gate insulating film 3 is formed to have a full thickness of about 300 nm to 500 nm. The a-Si:H film 4a is formed to have a full thickness of about 100 nm to 300 nm, and the $n^+$ a-Si:H film 5a is formed to have a full thickness of about 20 nm to 50 nm.

After forming the gate insulating film 3, the a-Si:H film 4a and the $n^+$ a-Si:H film 5a, a $N_2$ gas plasma discharge is performed in the same film formation apparatus for not shorter than 30 sec, while continuously applying 5 SLM of $N_2$ gas, keeping a pressure in the reactor to be 1.5 mbarr, and applying a high frequency of 50 W. After completing the discharge with such a $N_2$ gas plasma, a very thin silicon nitride film 6 is formed on the surface layer of the $n^+$ a-Si:H film 5a.

Then, to form the semiconductor layer and the ohmic contact layer by patterning the a-Si:H film 4a and the $n^+$ a-Si:H film 5a into an island, a resist pattern is formed by the photoengraving process on the silicon nitride film 6 formed on the surface layer of the $n^+$ a-Si:H film 5a. At this time, because the silicon nitride film 6 is hydrophilic, any occurrence of dry spot can be prevented in the drying step after the wet cleaning, before applying a photoresist.

Then, after forming a conductive thin film in the same manner as the prior art, a pair of electrodes (not illustrated) which form a semiconductor device with the semiconductor layer is formed by patterning by the photoengraving process, and TFT is formed by etching the ohmic contact layer using the pair of electrodes as a mask.

In this example according to the invention, as a result of performing continuously the plasma discharge using a relatively cheap $N_2$ gas in the same plasma CVD apparatus where the a-Si:H film 4a and the $n^+$ a-Si:H film 5a have been formed, thereby forming the very thin silicon nitride film 6 having a hydrophilic property on the surface layer of the $n^+$ a-Si:H film 5a, after forming the a-Si:H film 4a which forms the semiconductor layer of the TFT and the $n^+$ a-Si:H film 5a which forms the ohmic contact layer, it is now possible to prevent the occurrence of any dry spot, thereby preventing any occurrence of etch residue of the ohmic contact layer ($n^+$ a-Si:H film) due to the dry spot, in the drying step after the wet cleaning before applying the photoresist for patterning the $n^+$ a-Si:H film 5a. Further, since the silicon nitride film 6 is very thin, there is almost no influence on the TFT characteristic.

EXAMPLE 2

Although, in the foregoing example 1, the silicon nitride film 6 is formed on the surface layer of the n⁺ a-Si:H film 5a by the $N_2$ gas plasma discharge in the same film formation apparatus after forming the n⁺ a-Si:H film 5a, the same advantage as the foregoing example 1 can be achieved also by forming the silicon nitride film 6 on the surface layer of the n⁺ a-Si:H film 5a by the plasma discharge of a mixed gas of $N_2$ and He. In this case, as the He gas plasma has also an advantage of removing static electricity, it is possible to perform the removal of static electricity from the n⁺ a-Si:H film 5a at the same time as the formation of the thin silicon nitride film 6.

As for the conditions of plasma discharge using the mixed gas of $N_2$ and He, for example, the plasma discharge is performed for not shorter than 30 sec, while applying 1 SLM of $N_2$ gas and 4 SLM of He gas, keeping a pressure in the reactor to be 1.5 mbarr, and applying a high frequency of 50 W.

EXAMPLE 3

Figure 2:
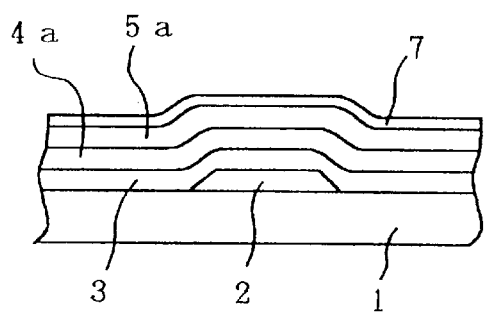
FIG. 2 is a sectional view of a thin film transistor under manufacture according to example 3 of the present invention.
Figure 3:
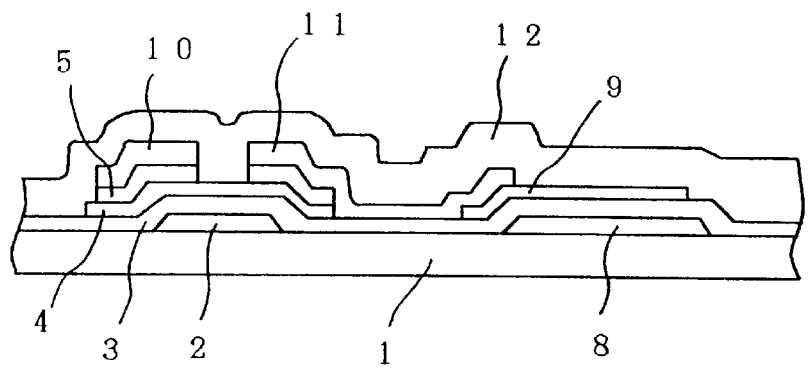
FIG. 3 is a sectional view of a TFT array substrate on which a thin film transistor according to the prior art is mounted.
Figure 4:
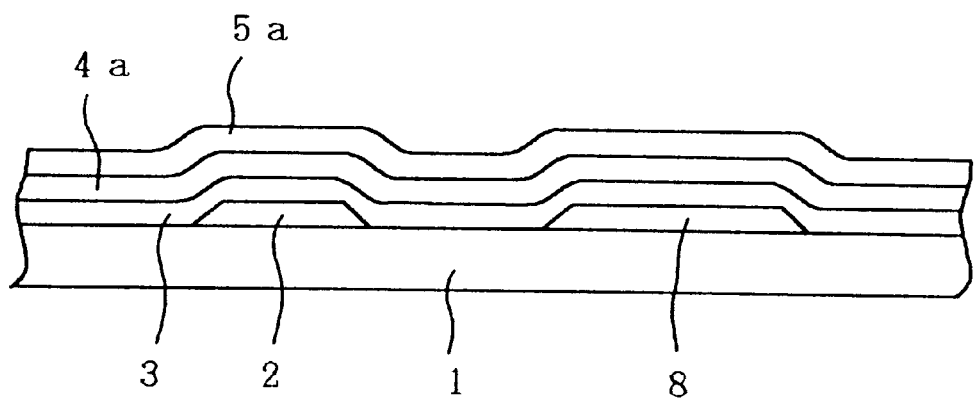
FIG. 4 is a sectional view of a thin film transistor under manufacture according to the prior art.

Although, in the foregoing example 1, the silicon nitride film 6 is formed on the surface layer of the n⁺ a-Si:H film 5a by the $N_2$ gas plasma discharge in the same film formation apparatus after forming the n⁺ a-Si:H film 5a, as shown in FIG. 2, the same advantage as the foregoing example 1 can be achieved also by forming a silicon oxide film 7 on the surface layer of the n⁺ a-Si:H film 5a by an $O_2$ gas plasma discharge.

As for the conditions of plasma discharge using the $O_2$ gas, for example, the plasma discharge is performed for not shorter than 30 sec, while applying 5 SLM of $O_2$ gas, keeping a pressure in the reactor to be 1.5 mbarr, and applying a high frequency of 50 W.

In addition, the silicon nitride film 6 in the foregoing examples 1 and 2 and the silicon oxide film 7 in this example 3 may be removed by buffered hydrofluoric acid treatment before forming the pair of electrodes.

EXAMPLE 4

In this example, a TFT array substrate, which is composed by arranging a TFT formed in the same manner as the foregoing examples 1, 2 and 3 and a picture element electrically connected to either of a pair of electrodes forming the TFT on an insulating substrate in the form of a matrix, is facing to a counter substrate on which a counter electrode, etc. are formed, and a liquid crystal is held between the TFT array substrate and the counter substrate, whereby a liquid crystal display device is formed.

In this example, as a result of forming a very thin silicon nitride or oxide film having a hydrophilic property on the surface layer of the a-Si:H film which forms the ohmic contact layer of the TFT, it is possible to prevent the occurrence of a dry spot on the n⁺ a-Si:H film, thereby preventing the occurrence of etch residue of the ohmic contact layer (n⁺ a-Si:H film) due to the dry spot, and therefore it is possible to obtain a highly reliable liquid crystal display having no etch residue of the n⁺ a-Si:H film which forms the ohmic contact layer, and on which a highly reliable thin film transistor is mounted at a high yield. In such a thin film transistor, the silicon nitride film and silicon oxide film each formed for giving a hydrophilic property to the n⁺ a-Si:H film do not give any bad or negative influence on the TFT characteristic and on the characteristic as a liquid crystal drive element.

What is claimed is:

1. A liquid crystal display comprising:

an insulating substrate;

a control electrode formed on said insulating substrate;

an insulating film formed on said control electrode;

a semiconductor layer formed on said control electrode through said insulating film;

a contact layer having upper and lower opposed surfaces, wherein the lower surface is formed on said semiconductor layer and a thin film nitride or oxide is formed along the upper surface of said contact layer;

a pair of electrodes, formed on an upper surface of the thin film nitride or oxide, forming a semiconductor device with said semiconductor layer;

a picture element electrode connected electrically to either of said pair of electrodes; and a counter substrate having a counter electrode for holding a liquid crystal material between itself and said insulating substrate.

2. The liquid crystal display of clam 1, wherein the semiconductor layer comprises hydrogenated amorphous silicon.

3. The liquid crystal display of claim 1, wherein the contact layer comprises n⁺ hydrogenated amorphous silicon.

4. The liquid crystal display of claim 1, wherein the insulating film is formed to a thickness of about 300 nm to 500 nm.

5. The liquid crystal display of claim 1, wherein the semiconductor layer is formed to a thickness of about 100 nm to 300 nm.

6. The liquid crystal display of claim 1, wherein the contact layer is formed to a thickness of about 20 nm to 50 nm.

7. The liquid crystal display of claim 1, wherein the thin film is a nitride film formed by $N_2$ gas plasma discharge.

8. The liquid crystal display of claim 1, wherein the thin film is an oxide film formed by $O_2$ gas plasma discharge.

* * * * *